(12) United States Patent
Wang et al.

(10) Patent No.: US 7,468,903 B2
(45) Date of Patent: Dec. 23, 2008

(54) CIRCUITS FOR IMPROVING READ AND WRITE MARGINS IN MULTI-PORT SRAMS

(75) Inventors: Dao-Ping Wang, Hsinchu (TW); Hung-Jen Liao, Hsinchu (TW); Kun Lung Chen, Taipei (TW); Yung-Lung Lin, Taichung (TW); Jui-Jen Wu, Hsinchu (TW); Chen Yen-Huei, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 94 days.

(21) Appl. No.: 11/598,385

(22) Filed: Nov. 13, 2006

(65) Prior Publication Data

US 2008/0112212 A1  May 15, 2008

(51) Int. Cl.
*G11C 11/00* (2006.01)
(52) U.S. Cl. .................................. 365/154; 365/202
(58) Field of Classification Search ................. 365/154, 365/202
See application file for complete search history.

(56) References Cited

U.S. PATENT DOCUMENTS

| | | | | |
|---|---|---|---|---|
| 5,708,599 A | * | 1/1998 | Sato et al. | 365/154 |
| 6,628,554 B2 | * | 9/2003 | Hidaka | 365/189.09 |
| 6,671,201 B2 | * | 12/2003 | Masuda | 365/154 |
| 6,826,074 B2 | * | 11/2004 | Yamauchi | 365/154 |
| 6,829,179 B2 | * | 12/2004 | Morikawa | 365/189.09 |
| 6,853,578 B1 | * | 2/2005 | Zhang et al. | 365/154 |

OTHER PUBLICATIONS

Shibata, Nobutaro et al., "0.5-V 25-MHz 1-mW 256-Kb MTCMOS/SOI SRAM for Solar-Power-Operated Portable Personal Digital Equipment—Sure Write Operation by Using Step-Down Negatively Overdriven Bitline Scheme", IEEE Journal of Solid-State Circuits, vol. 41, No. 3, Mar. 2006, pp. 728-742.
Yamauchi, Hiroyuki et al., "0.5 V Single Power Supply Operated High-Speed Boosted and Offset-Grounded Data Storage (BOGS) SRAM Cell Architecture", IEEE Transactions on Very Large Scale Integration (VLSI) Systems, vol. 5, No. 4, Dec. 1997, pp. 377-387.
Zhang, K., et al., "A 3-GHz 70Mb SRAM in 65nm CMOS Technology with Integrated Column-Based Dynamic Power Supply", ISSCC 2005/Session 26/Non-Volatile Memory/26.1, Digest of Technical Papers, 2005 IEEE International Solid-State Circuits Conference, pp. 474-475, 611.

* cited by examiner

*Primary Examiner*—Connie C Yoha
(74) *Attorney, Agent, or Firm*—K & L Gates LLP

(57) ABSTRACT

A system and method for writing a SRAM cell coupled to complimentary first and second bit-lines (BLs) is disclosed, the method comprising asserting a word-line (WL) selecting the SRAM cell to a first positive voltage, providing a second positive voltage at the first BL, providing a first negative voltage at the second BL, and asserting a plurality of WLs not selecting the SRAM cell to a second negative voltage, wherein the writing margin of the SRAM cell is increased.

17 Claims, 6 Drawing Sheets

CIRCUITS FOR IMPROVING READ AND WRITE MARGINS IN MULTI-PORT SRAMS

BACKGROUND

The present invention relates generally to integrated circuit designs and more particularly to write control circuit design for improving read and write margins in multi-port static random access memory (SRAM).

SRAM is typically used for storing data needed to be speed accessed by processing units. A conventional 6-T SRAM cell comprises two cross-coupled inverters forming a data latch and two pass-gate NMOS transistors for controlling accesses to the data latch by a bit-line-true (BLT) and a bit-line-complementary (BLC). During a read operation, the data latch drives the BLT or BLC to develop a differential voltage between the BLT and BLC, therefore a higher supply voltage provides a greater read margin. During a write operation, it is the BLT or BLC to force the data latch to flip, therefore, given a fixed BLT and BLC voltage level, a lower supply voltage provides a greater write margin.

FIG. 1 illustrates a prior-art SRAM column 100 with the conventional 6-T SRAM cells 102[0:n−1] and two positive voltage power supplies, CVDDHI and CVDDLO, where CVDDHI voltage is higher than CVDDLO voltage. When the SRAM column 100 is in a read operation, a signal YSWHI is asserted a logic LOW voltage while a signal YSWLO remains at a logic HIGH voltage, then the CVDDHI is coupled to a CVDD node to supply power to the SRAM cells 102[0:n−1]. During a write operation, a signal YSWLO is asserted the logic LOW voltage while the signal YSWHI remains at the logic HIGH voltage, the CVDDLO is coupled to the CVDD node.

The aforementioned prior-art system works well in a single port SRAM, where read and write operations occur always in different clock cycles. But in a multi-port SRAM, read and write operations may happen to SRAM cells in the same clock cycle. In this case, increasing read margin requires higher power supply voltage, while increasing write margin requires lower power supply voltage, they contradict with each other and render the prior-art system being unable to increase both read and write margins at the same time.

As such, what is desired is a power supply (VDD) management system that increases both read and write margins at the same time for SRAMs and particularly for dual-port SRAMs.

SUMMARY

The present disclosure provides for a method and system for writing a SRAM cell coupled to complimentary first and second bit-lines (BLs). The method comprises asserting a word-line (WL) selecting the SRAM cell to a first positive voltage, providing a second positive voltage at the first BL, providing a first negative voltage at the second BL, and asserting a plurality of WLs not selecting the SRAM cell to a second negative voltage, wherein the writing margin of the SRAM cell is increased.

The system comprises complementary first and second bit-lines (BLs) coupled to a plurality of SRAM cells, a write buffer configured to generate a first positive voltage at the BL and a first negative voltage at the second BL during a writing, and a word-line (WL) decoder configured to generate a second positive voltage at a selected WL and a second negative voltage at un-selected WLs during the writing, wherein the writing margin of the SRAM cell is increased.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a write circuit that varies voltages during different operations for simultaneously expanding read and write margins in a dual-port SRAM.

Figure 1:
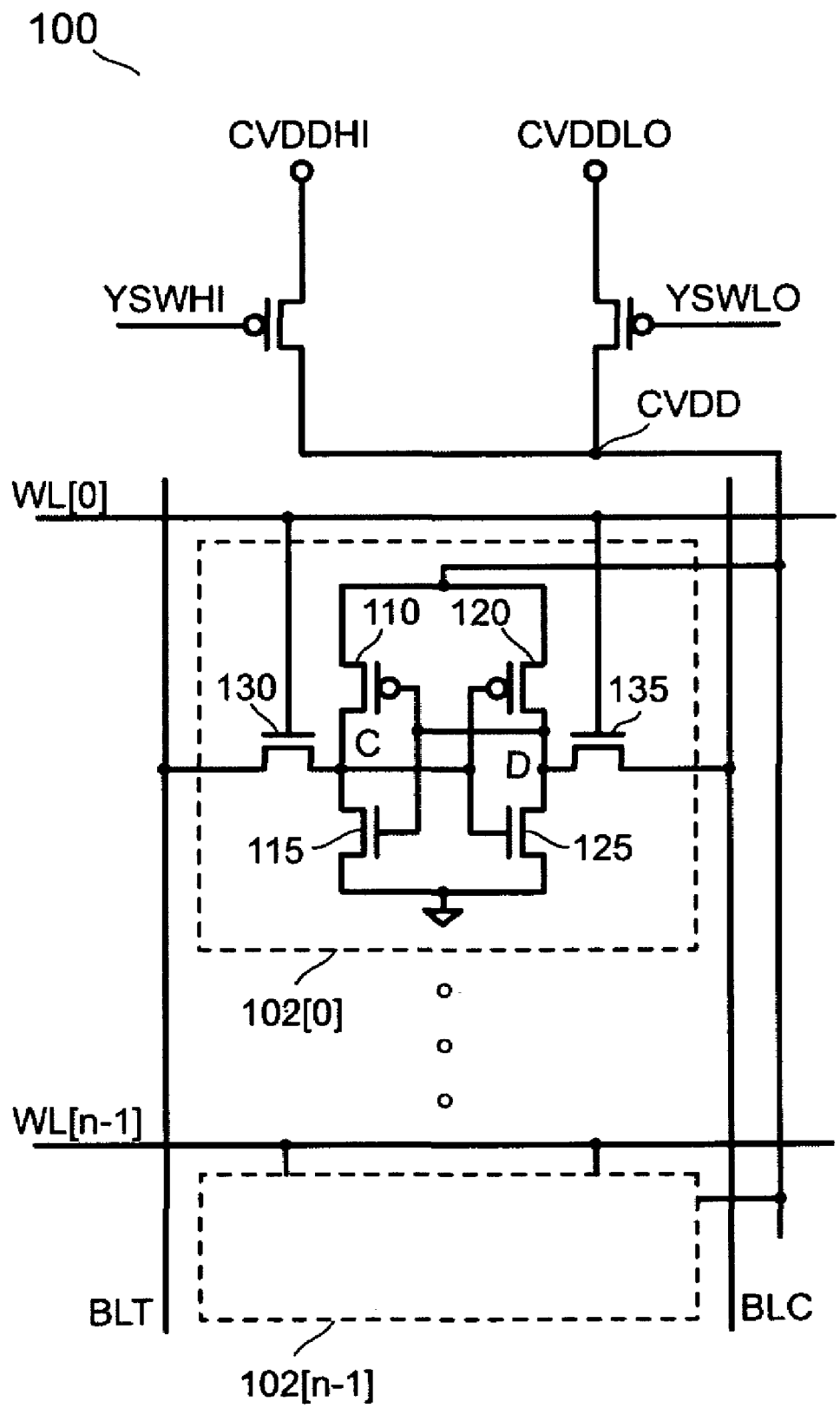
FIG. 1 is a schematic diagram illustrating a prior-art SRAM column with a dual-voltage power supply.

FIG. 1 has already been described and discussed as the relevant background to the present invention. They require no further discussion here.

Figure 2:
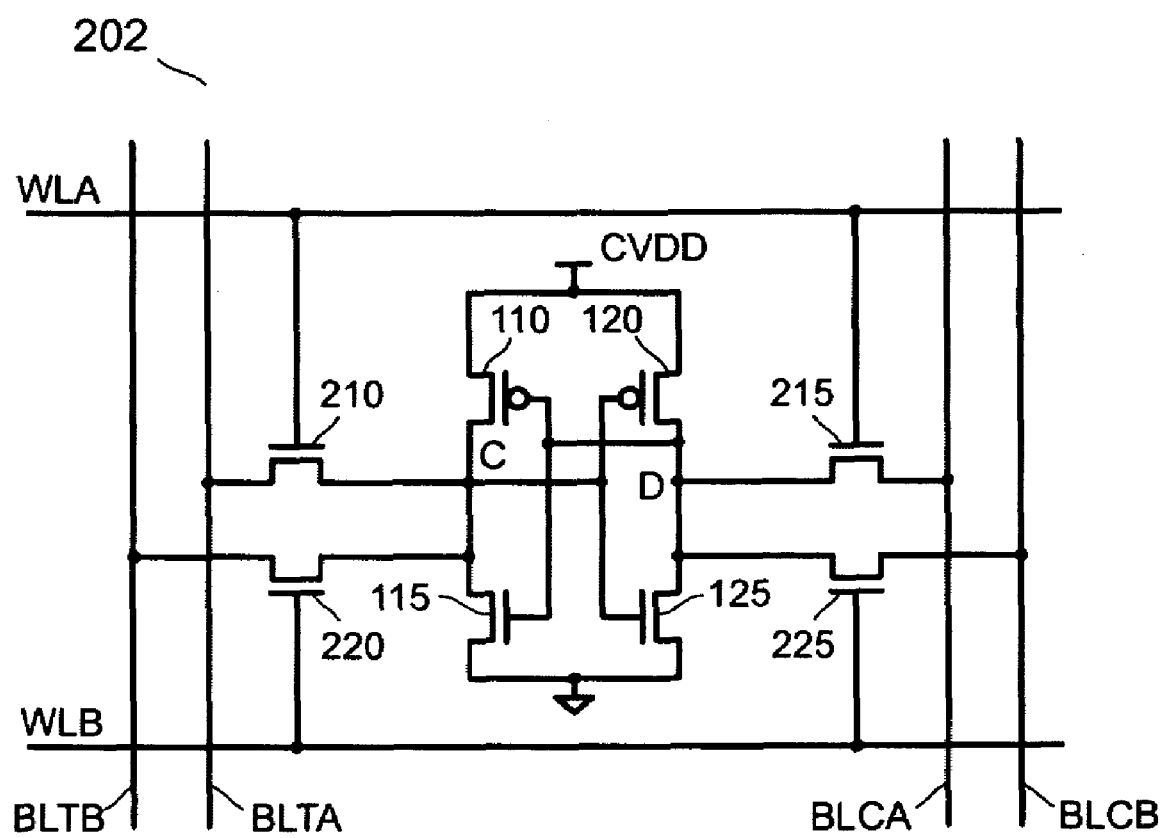
FIG. 2 is a schematic diagram illustrating a conventional 8-T dual-port SRAM cell.

FIG. 2 is a schematic diagram illustrating a conventional 8-T dual-port SRAM cell 202. Two PMOS transistors 110 and 120 and two NMOS transistors 115 and 125 are connected as two cross-coupled inverters which forms a data latch with two storage nodes C and D. Two pass-gate NMOS transistors 210 and 215 couple the nodes C and D to a bit-line pair, BLTA and BLCA, respectively. Two other pass-gate NMOS transistors 220 and 225 couple the nodes C and D to another bit-line pair, BLTB and BLCB, respectively. The gates of the pass-gate NMOS transistors 210 and 215 are commonly coupled to a word-line WLA, while the gates of the pass-gate NMOS transistors 220 and 225 are commonly coupled to a word-line WLB. To form a column of a memory array, a plurality of the dual-port SRAM cells are coupled to the bit-lines and data are always accessed through the bit-lines. Therefore, the BLTA and BLCA may be designated as one port, PORTA, of a column of the dual-port SRAM cell 202, while the BLTB and BLCB may be designated as another port, PORTB of the same. Both ports, PORTA and PORTB may be accessed simultaneously, but which cell is accessed is determined by the word-lines.

In a SRAM array with dual-port SRAM cells, in order to increase its read margin, the cell power supply voltage (CVDD) should be kept high; while in order to increase write margin, the CVDD should be kept low. Conventionally, all the cells in a column are coupled to one power supply voltage. If both the read and written cells are in the same column, then the CVDD can only be changed to one direction, either go higher for increasing the read margin or go lower for increasing the write margin. The read and writing margins cannot be increased at the same time in conventional systems.

Due to the fact that in a write operation, a flipping bit-line swings from the CVDD to a complementary ground voltage (GND), and trying to flips the data latch of the SRAM cell 202 if an opposite data is being written, if the bit-line voltage is further lowered to a negative voltage (NEG), then it will be equivalent to increasing the CVDD. Therefore, the present invention proposes a system to maintain the CVDD at a high level through out both read and write operation, but pulse the flipping bit-line to a negative voltage, so that both read margin is maintain and at the same time write margin is expanded. Since reading and writing occur always in different bit-line pairs, people having skill in the art would recognize that the present invention can also be combined with switching the cell power supply to a voltage higher than the CVDD (CVDDHI shown in FIG. 1) during an all-read operation in a column.

Following TABLE 1 summarizes the power supply and bit-line voltages for various read and write operations. If both the PORTA and PORTB are being read or one port is being read and the other is not selected, the cell power supply can be switched to the CVDDHI, and the flipping bit-line remains at GND. Whenever a port is written, its flipping bit-line will force the negative voltage, NEG, and the cell power supply remains at CVDD. Of course, when both the ports are not selected, the CVDD and GND are maintained.

| Power supply | | PORTA | | |
|---|---|---|---|---|
| voltage/Flipping bit-line voltage | | Reading | Writing | Not-selected |
| PORTB | Reading | CVDDHI/ GND | CVDD/ NEG | CVDDHI/ GND |
| | Writing | CVDD/ NEG | CVDD/ NEG | CVDD/ NEG |
| | Not-selected | CVDDHI/ GND | CVDD/ NEG | CVDD/ GND |

Referring to FIG. 2, a side effect of lowering a bit-line voltage, e.g. BLTA, to negative is that the pass-gate transistor, e.g. 210, coupled to it may cause a large leakage or even be turned on if the bit-line, BLTA, voltage is too negative. Such a condition is detrimental to the data retention of those un-selected cells on the same bit-line. In order to prevent it from happening, the present invention proposes to pulse all the un-selected word-lines also to a negative voltage, while the selected word-lines are asserted a normal positive voltage to turn on the pass-gate NMOS transistors.

Figure 3:
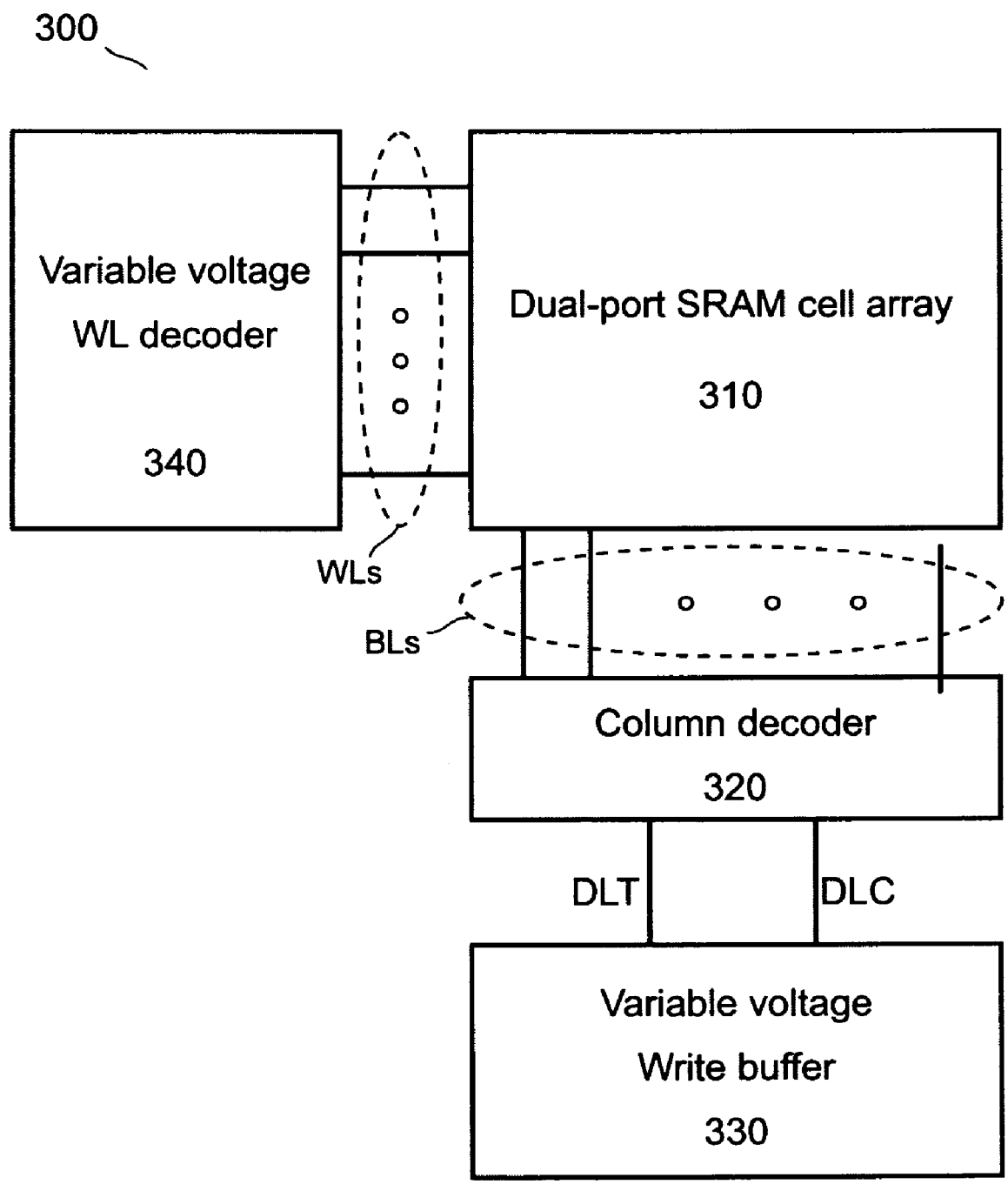
FIG. 3 is a block diagram illustrating a dual-port SRAM with a variable voltage write circuit according to an embodiment of the present invention

FIG. 3 is a block diagram illustrating a dual-port SRAM 300 with a variable voltage write circuit according to an embodiment of the present invention. The dual-port SRAM 300 comprises a dual-port SRAM cell array 310, a column decoder 320, a variable voltage write buffer 330 and a variable voltage WL decoder 340. A data-true-true (DLT) signal and a data-line-complementary (DLC) signal are coupled between the column decoder 320 and 330. Here only one bit of data is illustrated, one with skills in the art would have no difficulty expanding this embodiment to multi-bit SRAMs. The column decoder 320 outputs BLs to the dual-port SRAM cell array 310. The variable voltage WL decoder 340 supplies WL signals to the dual-port SRAM cell array 310. A function of the variable voltage write buffer 330 is to generate a negative pulse during a write operation on either DLT or DLC, depending on whether a logic '1' or a logic '0' is being written. Then the negative pulse is passed on to a selected bit-line by the column decoder 320. Correspondingly, a function of the variable voltage WL decoder is to generate negative pulses on all the un-selected WLs of the dual-port SRAM array 310 during the write operation, while providing a positive voltage on the selected WL(s).

Figure 4:
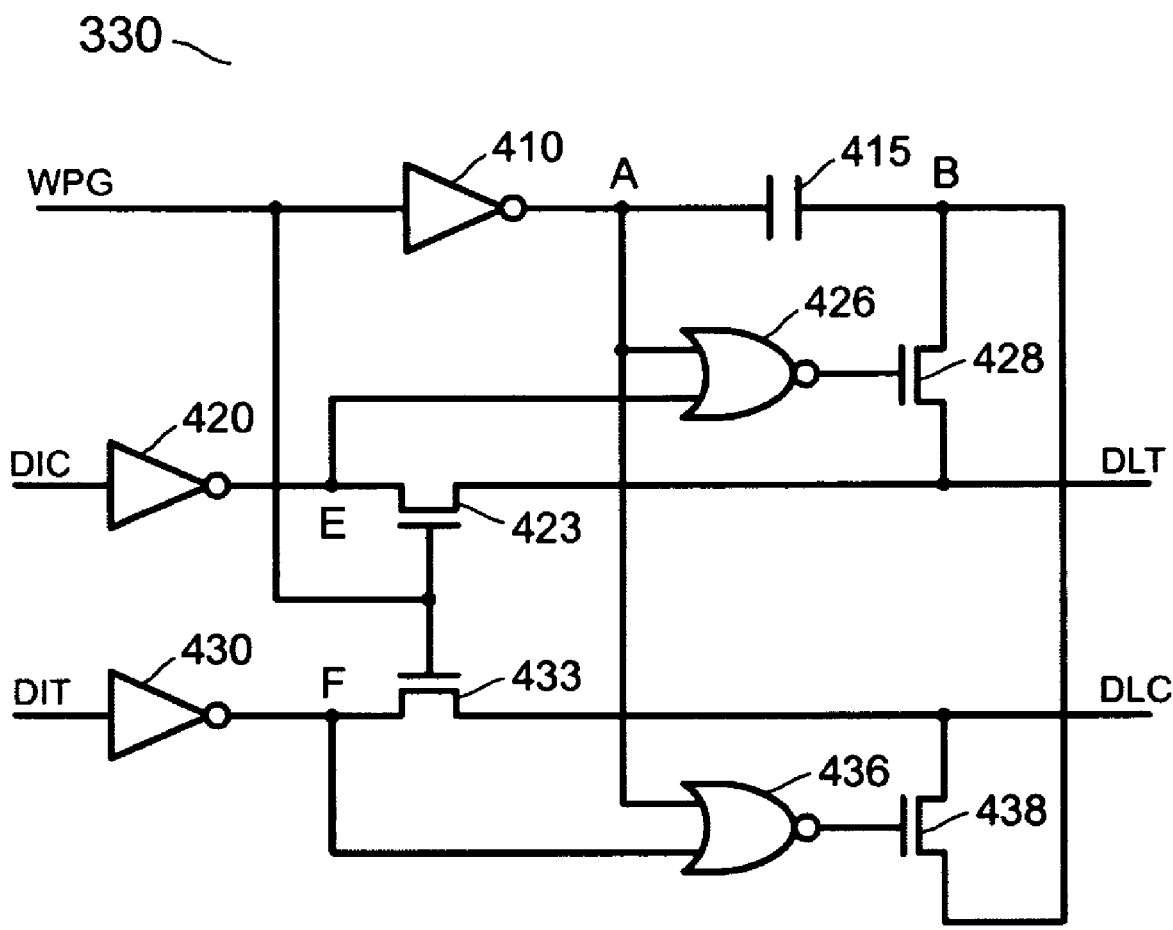
FIG. 4 is a schematic diagram illustrating an implementation of the variable voltage write buffer according to the embodiment of the present invention.

FIG. 4 is a schematic diagram illustrating an implementation of the variable voltage write buffer 330 according to the embodiment of the present invention. The variable voltage write buffer 330 comprises a capacitor 415, which serves as a charge pump element for generating a negative pulse either on DLT or DLC. Writing is activated by a pulse signal WPG, which is coupled to the gates of two pass-gate NMOS transistor 423 and 433 coupled to the data-lines DLT and DLC, respectively. NMOS transistors 428 and 438 are coupled between a terminal of the capacitor 415 and the data-lines DLT and DLC, respectively. NOR gates 426 and 436 generate proper signals to turn on or off the NMOS transistor 428 and 438. Inverters 420 and 430 simply serve as drivers for DLT and DLC, respectively.

Assuming the CMOS variable voltage write buffer 330 operates between the CVDD and GND voltages, and before a write operation, the signal WPG is at the GND voltage. Then a node A is at the CVDD, which charges up the capacitor 415 with the node A side of the capacitor 415 stores positive charges. Assuming a '0' is intended to be written, therefore, signals DIC and DIT are at the CVDD and GND voltage, respectively. With the arrival of a positive write pulse at the signal WPG, the pass-gate NMOS transistors 423 and 433 are turned on, and node A as well as node E are turned to the GND voltage, which results in the NOR gate 426 outputting the CVDD voltage to a gate of the NMOS transistor 428 to turn it on. Then the charges stored in the capacitor 415 will discharge to the DLT through the NMOS transistor 428, which will force the DLT to drop to lower than the node A GND voltage. In this way, a desired negative voltage is produced at the DLT for writing. Meanwhile, node F is at the CVDD voltage, which results in the NOR gate 436 outputting the GND voltage to turn off the NMOS transistor 438, so that the DLC is at the CVDD voltage.

A person with skills in the art would realized that the variable voltage write buffer 330 operates, symmetrically in regard to the DLT and DLC, i.e., when a '1' is intended to be written, the negative voltage will be generated at the DLC, and the DLT generates the CVDD voltage. A duration and average magnitude of the negative voltage at the data-line are determined by a size of the capacitor 415. The larger the size of the capacitor 415, the longer the duration, and the higher the average magnitude of the negative voltage.

Figure 5:
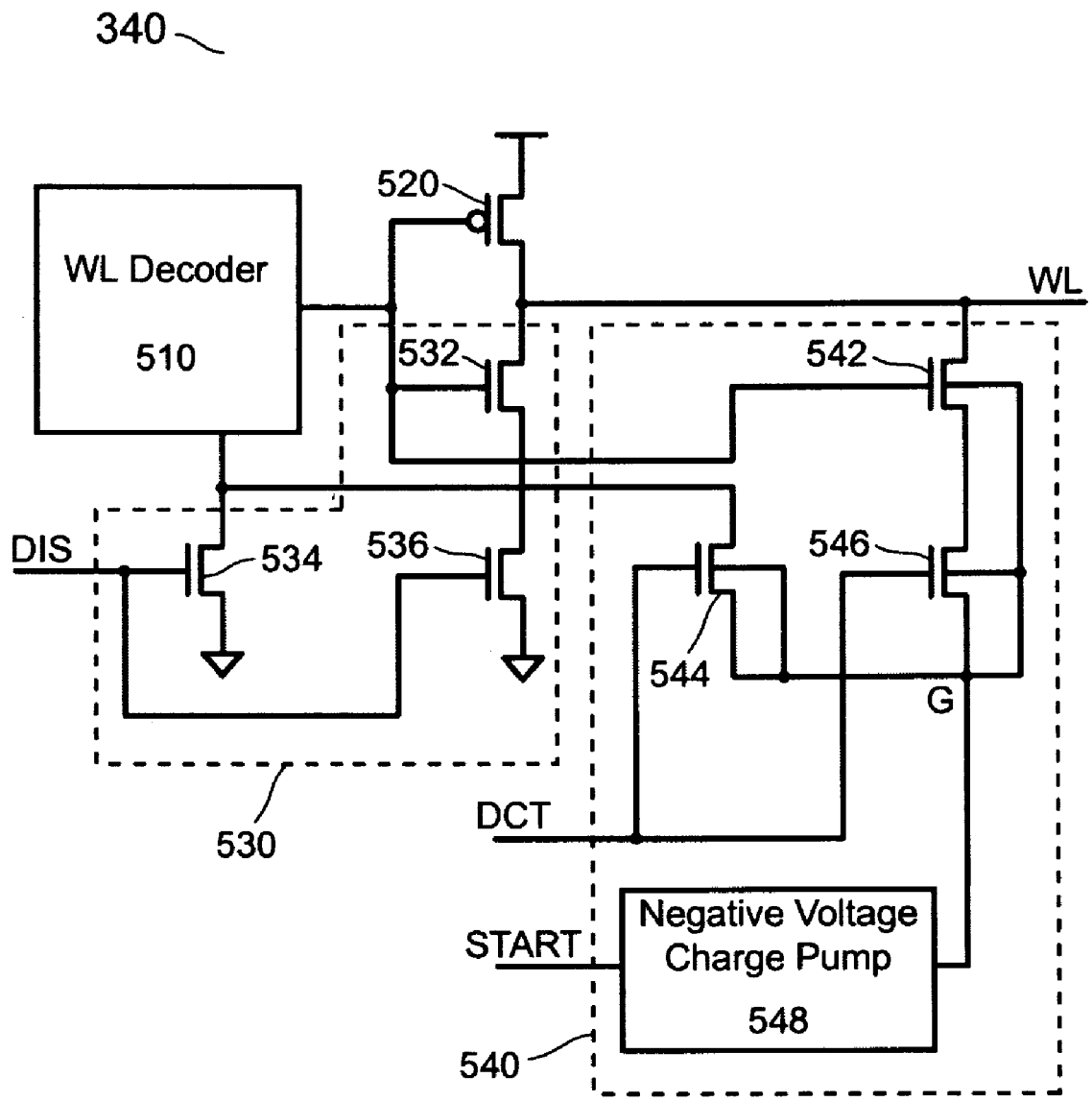
FIG. 5 is a schematic diagram illustrating an implementation of variable voltage WL decoder according to the embodiment of the present invention.

FIG. 5 is a schematic diagram illustrating an implementation of variable voltage WL decoder 340 according to the embodiment of the present invention. The variable voltage WL decoder 340 comprises a decoder module 510, a PMOS transistor 520, a pull-to-GND module 530 and a pull-to-negative module 540. The decoder module 510 selects a WL based on an input address. Assuming the CMOS variable voltage WL decoder 340 also operates between the CVDD and GND voltages. When a WL is selected, its corresponding decoder module 510 will output a GND voltage at a node G, which turns on the PMOS transistor 520. Then a CVDD voltage will be forced at the WL. So for selected WLs, the variable voltage WL decoder 340 works just as a conventional WL decoder.

A conventional WL decoder would only have the decoder module 510 and the pull-to-GND module 530. The pull-to-negative module 540 differs from the pull-to-GND module 530 in that sources and bulks of NMOS transistors 544 and 546 in the pull-to-negative module 540 are coupled to an output of a negative voltage charge pump 548 at a node N. Other than that, NMOS transistors 532, 534 and 536 in the pull-to-GND module 530 are equivalent to NMOS transistors 542, 544 and 546 in the pull-to-negative module 540, respectively. A signal DIS is coupled to gates of the NMOS transistors 534 and 536 in the pull-to-GND module 530. A signal DCT is coupled to gates of the NMOS transistors 544 and 546 in the pull-to-negative module 540. During a write operation, the signal DIS is at GND voltage to disable the pull-to-GND module 530, while the signal DCT is at CVDD voltage to enable the pull-to-negative module 540.

When the WL is not selected, the node G voltage is at CVDD, which turns off the PMOS transistor 520 and turns on both the NMOS transistors 532 and 542. During a write operation, the pull-to-negative module 540 will be enabled; a signal START controls the negative voltage charge pump 548 to output a pulse of negative voltage at node N, so that the WL will be a negative pulse during a write operation. The duration and magnitude of the WL negative pulse should substantially match the bit-line negative pulse, so that no leakage or turn-on of the cell pass-gate NMOS transistor will occur. During a read or standby operation, the pull-to-GND instead will be enabled, so that the GND voltage will be presented at the WL.

Although the present invention is described using a dual-port SRAM as an example, a person with skills in the art would appreciate that the present invention may well be applied to single-port SRAMs as well as SRAMs with more than two ports.

Although no detailed implementation of the negative voltage charge pump 548 is described in the present disclosure, a person with skill in the art would recognize that numerous prior-art negative voltage charge pumps may well serve the purpose.

Figure 6:
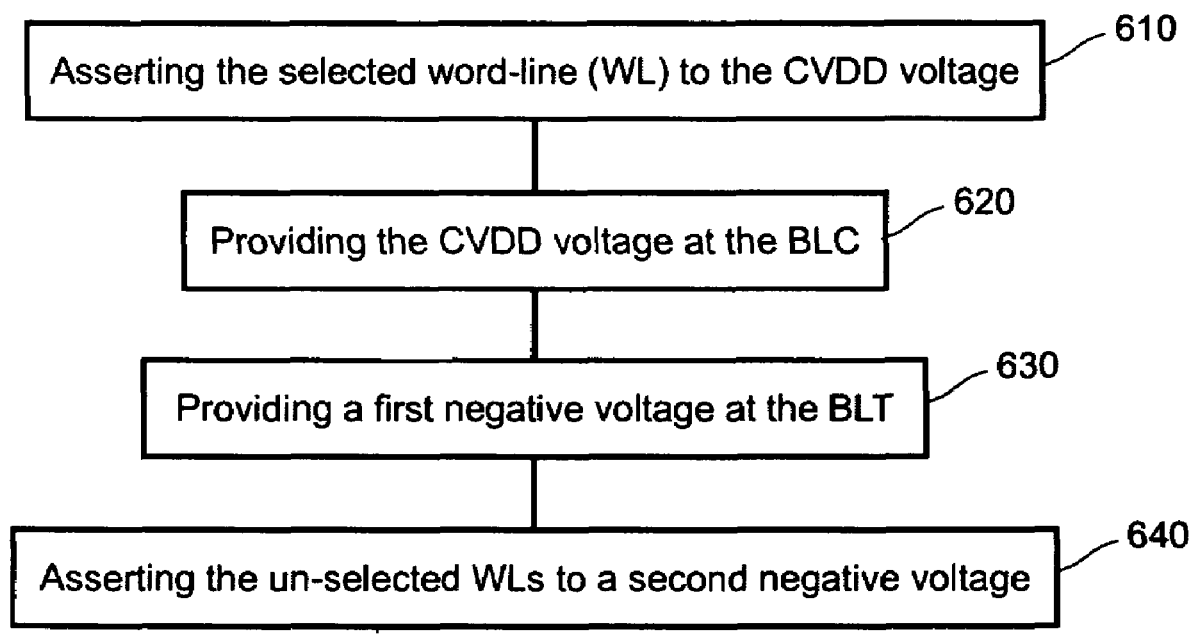
FIG. 6 is a flow chart illustrating general steps of writing a SRAM cell with a negative bit-line voltage according to the embodiment of the present invention.

FIG. 6 is a flow chart illustrating general steps of writing a SRAM cell with a negative bit-line voltage according to the embodiment of the present invention. Referring to both FIGS. 3 and 6, in step 610, the variable voltage WL decoder 340 asserts a selected WL to the CVDD voltage. In steps 620 and 630, one of the BL (BLC) is provided with the CVDD voltage, and the other BL (BLT) is provided with a first negative voltage. The negative voltage at the BLT is intended to flip the data latch in the SRAM cell. In order to prevent leakage or even the cell pass-gate transistors turned-on, those un-selected WLs are asserted a second negative voltage. The first and second negative voltage may be pulsed with a substantially identical duration.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. A method for writing a SRAM cell coupled to complimentary first and second bit-lines (BLs), the method comprising:
    asserting a word-line (WL) selecting the SRAM cell to a first positive voltage;
    providing a second positive voltage at the first BL;
    providing a first negative voltage at the second BL; and
    asserting a plurality of WLs not selecting the SRAM cell to a second negative voltage, wherein the asserting the second negative voltage further comprises providing a third negative voltage at a source and bulk of a NMOS transistor with a drain coupled to one of the plurality of WLs, and
    wherein the writing margin of the SRAM cell is increased.

2. The method of claim 1, wherein the first and second positive voltages equal to a cell power supply voltage (CVDD).

3. The method of claim 1 wherein the providing the first negative voltage is subsequent to the asserting the WL.

4. The method of claim 1, wherein the providing the first negative voltage is substantially simultaneous with the asserting the plurality of WLs.

5. The method of claim 1, wherein the first and second negative voltages are pulsed.

6. The method of claim 1, wherein the providing the first negative voltage further comprises:
    storing charges in one or more capacitors prior to a writing; and
    discharging the capacitors onto the second BL.

7. The method of claim 1, wherein the third negative voltage is provided by a negative voltage charge pump.

8. The method of claim 1, wherein the SRAM cell has two or more ports.

9. A method for writing a multi-port SRAM cell coupled to complimentary first and second bit-lines (BLs), the method comprising:
    asserting a word-line (WL) selecting the SRAM cell to a first positive voltage;
    providing a second positive voltage at the first BL;
    providing a first negative voltage at the second BL subsequent to the asserting the WL; and
    asserting a plurality of WLs not selecting the SRAM cell to a second negative voltage substantially simultaneously with the providing the first negative voltage, wherein the asserting the second negative voltage further comprises providing a third negative voltage at a source and bulk of a NMOS transistor with a drain coupled to one of the plurality of WLs, and
    wherein the writing margin of the multi-port SRAM cell is increased.

10. The method of claim 9, wherein the first and second positive voltages equal to a cell power supply voltage (CVDD).

11. The method of claim 9, wherein the first and second negative voltages are pulsed.

12. The method of claim 9, wherein the providing the first negative voltage further comprising:
    storing charges in one or more capacitors prior to a writing; and
    discharging the capacitors onto the second BL.

13. The method of claim 9, wherein the third negative voltage is provided by a negative voltage charge pump.

14. A SRAM writing system comprising:
   complementary first and second bit-lines (BLs) coupled to a plurality of SRAM cells;
   a write buffer configured to generate a first positive voltage at the BL and a first negative voltage at the second BL during a writing; and
   a word-line (WL) decoder configured to generate a second positive voltage at a selected WL and a second negative voltage at un-selected WLs during the writing, wherein the WL decoder comprises a plurality of WL decoder-driver modules each of which comprises:
   a WL address decoding unit;
   a pull-to-GND unit for pulling a corresponding WL to the GND during non-write operations; and
   a pull-to-negative unit for pulling the corresponding WL to the second negative voltage during a writing, wherein the pull-to-negative unit further comprises a negative voltage charge pump coupled to a source and bulk of a NMOS transistor with a drain coupled to the corresponding WL, and
   wherein the writing margin of the SRAM cell is increased.

15. The SRAM writing system of claim 14, wherein the first and second positive voltages equal to a cell power supply voltage (CVDD).

16. The SRAM writing system of claim 14, wherein the write buffer comprises a column decoder configured to select a BL pair from a plurality of BL pairs based on an input address for applying the first positive and negative voltages during a writing.

17. The SRAM writing system of claim 16, wherein the write buffer comprises:
   one or more capacitors coupled to both the first and second BLs through a first and second switching NMOS transistors, respectively;
   a first and second NOR gate controlling the first the second switching NMOS transistors, respectively, wherein a first input of the first NOR gate is coupled to the first BL, and a first input of the second NOR gate is coupled to the second BL, and a second input and the first NOR gate and a second input of the second NOR gate are commonly coupled to a write pulse signal,
   wherein the first switching NMOS transistor is switched on when the first BL is applied a ground voltage (GND), and the write pulse signal is asserted.

* * * * *